US011428751B1

(12) United States Patent
Ordonez

(10) Patent No.: US 11,428,751 B1
(45) Date of Patent: Aug. 30, 2022

(54) CABLE VERIFICATION SYSTEM FOR TELECOMMUNICATION CABLES

(71) Applicant: Starburst Industries LLC, Jacksonville Beach, FL (US)

(72) Inventor: Pablo Ordonez, St. Augustine, FL (US)

(73) Assignee: Starburst Industries LLC, Jacksonville Beach, FL (US)

( * ) Notice: Subject to any disclaimer, the term of this patent is extended or adjusted under 35 U.S.C. 154(b) by 0 days.

(21) Appl. No.: 17/592,501

(22) Filed: Feb. 3, 2022

(51) Int. Cl.
*G01R 31/58* (2020.01)
*H04B 3/46* (2015.01)

(52) U.S. Cl.
CPC ............... *G01R 31/58* (2020.01); *H04B 3/46* (2013.01)

(58) Field of Classification Search
CPC ........ G01R 31/58; G01R 31/28; G01R 31/11; H04B 3/46; H04L 43/50
See application file for complete search history.

(56) References Cited

U.S. PATENT DOCUMENTS

| | | | |
|---|---|---|---|
| 5,436,555 A | 7/1995 | Locke et al. | |
| 6,215,314 B1* | 4/2001 | Frankewich, Jr. | G01R 31/54 324/529 |
| 6,798,183 B2 | 9/2004 | Bohley et al. | |
| 7,305,067 B1 | 12/2007 | Diggle, III | |
| 7,598,721 B2 | 10/2009 | Kahkoska et al. | |
| 8,649,883 B2 | 2/2014 | Lu et al. | |
| 10,161,829 B2 | 12/2018 | Brillhart et al. | |
| 10,284,632 B2 | 5/2019 | Kanne et al. | |
| 10,591,528 B2 | 3/2020 | Mercer et al. | |
| 2005/0052190 A1* | 3/2005 | McCosh | G01B 11/024 324/644 |
| 2012/0059605 A1 | 3/2012 | Chimanbhai et al. | |
| 2012/0306895 A1* | 12/2012 | Faulkner | H04B 3/46 379/27.01 |

* cited by examiner

*Primary Examiner* — Son T Le
(74) *Attorney, Agent, or Firm* — Marks Gray, P.A.; Mitchell Ghaneie; Christopher Roberts

(57) ABSTRACT

An exemplary embodiment of the present invention provides a cable verification system for efficiently tracing, identify, and performing cable verification testing for one or more telecommunication cables. The cable verification system comprises one or more auxiliary testing devices, a software application, a portable communication device, a network, a probe, and a network cable testing device. The one or more auxiliary testing devices each are capable of being remotely controlled and operated.

15 Claims, 10 Drawing Sheets

CABLE VERIFICATION SYSTEM FOR TELECOMMUNICATION CABLES

BACKGROUND OF THE INVENTION

A. Field of the Invention

The present disclosure generally pertains to the telecommunication industry. More specifically, a cable verification system for telecommunication cables discloses an apparatus, system, and method of use which improves the efficiency of performing various services which a service technician may be required to perform in connection within installation or troubleshooting of one or more telecommunication cables.

B. Prior Art

Conventional cable testing requires a telecommunications service technician travel between two or more locations to identify and validate one or more twisted pairs or fiber optic cables which are to be tested. During conventional cable testing the telecommunications service technician, hereinafter referred to as the "technician," must initially connect a tone generator to a twisted pair of wires, or a visual fault locator to a fiber optic cable, at a first connection point, such as at a network interface device or a terminal. The tone generator, or visual fault locator, once communicably coupled to the twisted pair, or fiber optic cable, generates and transmits a detectable signal, hereinafter referred to as a "tone," from the first connection point to a second connection point. Hereinafter the tone generator and visual fault locator will each be referred to as a "tone generator".

Subsequently, during said conventional cable testing, the technician must then travel to the second connection point, often a service area interface, such as a cross-box, and use a probe to identify the twisted pair, or fiber optic cable, that the tone generator is communicably coupled to. After the tone is identified at the second connection point, the technician must travel back to the location of the first connection point to disconnect and retrieve the tone generator. The technician must return to the second connection point to perform one or more cable verification, qualification, or certification tests.

The amount of time spent by the technician traveling between the first and second connection points can consume a significant amount of time. Moreover, many telecommunication service providers penalize a technician if he or she spends more than a predetermined amount of time on a particular job. As a result, technicians are highly incentivized to reduce the amount of time spent cable testing, which may influence the technician to deviate from standard procedures to save time.

Accordingly, what is needed is a more efficient cable verification system for telecommunication cables which allows a technician to reduce the amount of traveling in order to validate and perform one or more cable verification tests.

BRIEF SUMMARY OF THE INVENTION

An exemplary embodiment of the present invention provides a cable verification system for telecommunication cables comprising one or more auxiliary testing devices, a software application, a portable communication device, a network, a probe, and a network cable testing device. The one or more auxiliary testing devices each comprise a control board, a power supply, a plurality of latching relays, and one or more pairs of leads. The one or more auxiliary testing devices may each further comprise a GPS. The control board provides a tone generator and a wireless transceiver. The wireless transceiver is configured to be capable of connecting to the network.

Each of the one or more auxiliary testing devices are installed at a distinct first connection point. The first connection point may take place at a network interface device, substantially located at an end-user premises, or at a terminal, located nearby the end-user premises. The wireless transceiver allows the auxiliary testing device to be remotely controlled and operated by the technician using the portable communication device. Such remote control and operation comprises the activation, and deactivation, of the tone generator as well as actuation of one or more of the plurality of latching relays.

Actuating one or more of the plurality of latching relays allows for the technician to remotely perform one or more cable verification tests. Such cable verification tests may include testing continuity and fault identification. While other testing devices and processes may be utilized to perform continuity testing and fault identification, such other testing devices take additional time to setup and perform after the one or more twisted pairs, or fiber optic cables, are traced and validated. Furthermore, it is advantageous and more efficient to initially test continuity and identify faults before performing other cable qualification or certification tests with the network cable testing device.

After the one or more auxiliary testing devices have been installed at their respective first connection points, the technician then uses a probe at a service interface area, such as a cross-box, to identify each of the one or more twisted pairs or fiber optic cables which are communicably coupled to the auxiliary testing device. After each of the twisted pairs, or fiber optic cables, are traced and validated at the service interface area, the technician may then proceed to use the portable communication device, via the software application, to remotely deactivate the tone generator and subsequently perform one or more cable verification tests, such as testing continuity and fault identification, for each of the twisted pairs, or fiber optic cables, that are communicably coupled to the auxiliary testing device.

Alternatively, the technician may trace, identify, and perform one or more cable verification tests for a single twisted pair, or a fiber optic cable, that is communicably coupled to the auxiliary testing device before proceeding to trace, identify, and test other twisted pairs, or fiber optic cables, that are communicably coupled to the auxiliary testing device.

After the technician has completed the one or more verification tests for each twisted pair or fiber optic cable, the technician can then proceed to perform additional qualification or certification testing with the network cable testing device. After the technician has completed all required cable testing, he or she then must return to the first connection point of each twisted pair, or fiber optic cable, to disconnect and retrieve the auxiliary testing device. It is anticipated in an alternative embodiment of the present invention that the auxiliary testing device may already be installed at each network interface device and be accessible from the service area interface without requiring the technician physically travel to the first connection point to initially install and subsequently disconnect and retrieve the auxiliary testing device.

Other apparatuses, systems, or methods in accordance with embodiments of the present invention will be or become apparent to one with skill in the art upon examination of the following drawings and detailed description. It is intended that all such additional apparatuses, systems, or methods be included within this description, be within the scope of the present invention, and be encompassed by the accompanying claims.

REFERENCE NUMBERS

Figure 1:
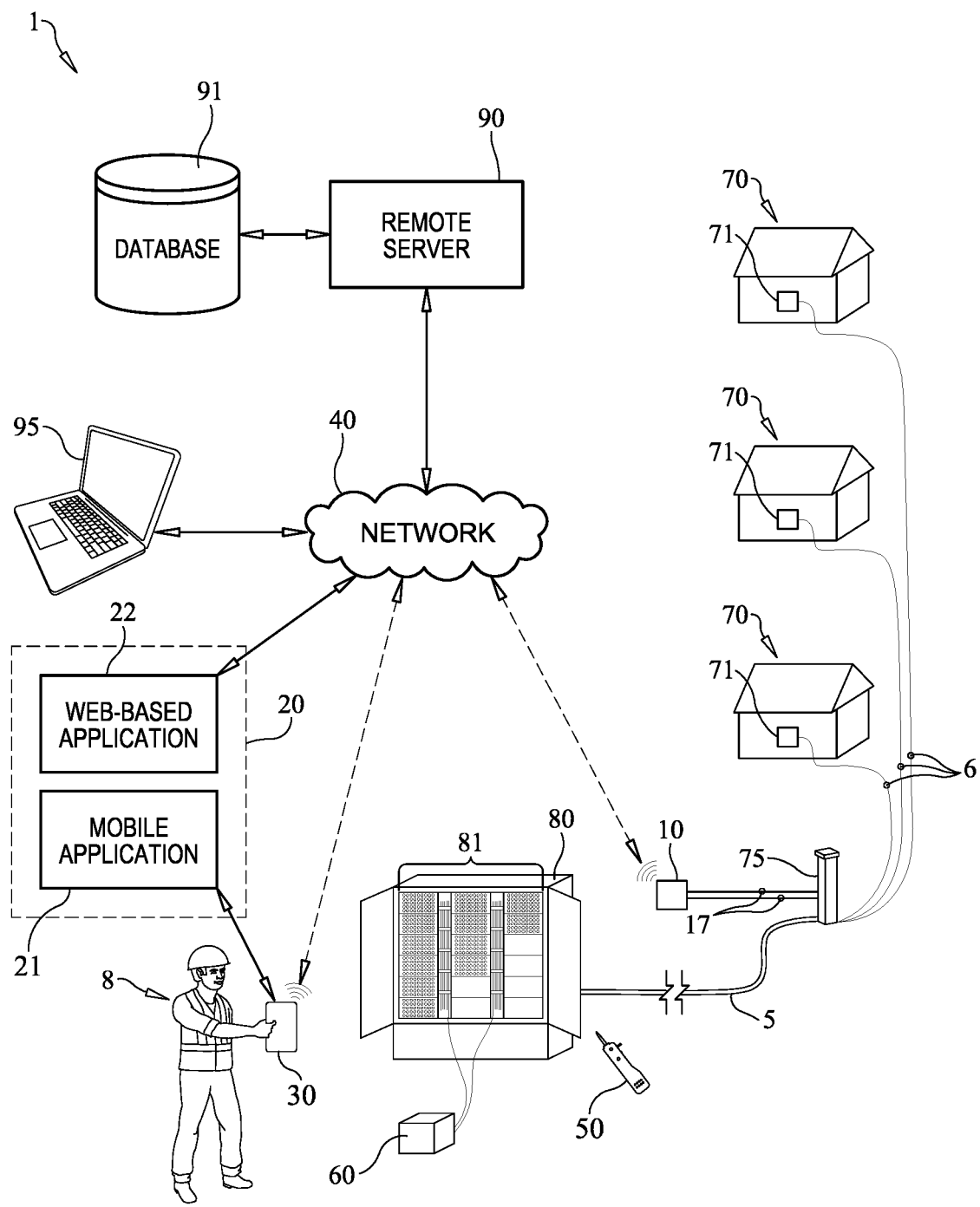
FIG. 1 illustrates a schematic diagram showing the conjunctive relationship of an exemplary embodiment of a cable verification system for telecommunication cables wherein an auxiliary testing device is connected to one or more twisted pairs at a terminal.

1—Cable Verification System
5—Cable
6—Twisted Pair
7—Wire
8—Technician
9—Circuit
9A—First Connection Point
9B—Second Connection Point
10—Auxiliary Testing Device
11—Device ID
12—Control Board
13—Tone Generator
14—Wireless Transceiver
15—Latching Relay
16—Power supply
17—Pair of Leads
17A—Connector
18—GPS
19—Housing
20—Software Application
21—Mobile Application
22—Web-Based Application
24—Logic Sequence
25—Plurality of Control Features
30—Portable Communication Device
40—Network
50—Probe
60—Network Cable Testing Device 70—End-User Premises
71—Network Interface Device
75—Terminal
80—Cross-Box
81—Plurality of Connection Terminals
90—Remote Server
91—Database
95—Work Station.

DETAILED DESCRIPTION OF THE EMBODIMENTS

It is to be understood that the figures and descriptions of the various embodiments of the present invention described herein, among others, have been simplified to illustrate representative elements of a cable verification system for telecommunication cables 1 that are relevant for a clear understanding of the present invention, while disregarding, for purposes of clarity, other elements of the cable verification system for telecommunication cables 1, hereinafter referred to as the cable verification system 1. Those of ordinary skill in the art will appreciate that such other elements may be found in conventional cable testing instruments and may be readily understood.

The various embodiments of the present invention described herein, among others, are generally directed to an apparatus, system, and method for tracing and performing one or more cable verification tests for one or more telecommunication cables 5. Such telecommunication cables 5, hereinafter referred to as cables 5, conventionally comprise one or more twisted pairs 6 of copper wires, hereinafter referred to as one or more twisted pairs 6. It is anticipated that the cable 5 may alternatively be a fiber optic cable that is comprised of a plurality of optical fibers configured to transmit light.

The cable verification system 1 comprises one or more auxiliary testing devices 10, a software application 20, a portable communication device 30, a network 40, a probe 50, and a network cable testing device 60. The software application 20 may comprise a mobile application 21 or a web-based application 22. The portable communication device 30, being capable of wirelessly accessing the network 40, may utilize the mobile application 21 or web-based application 22. The portable communication device 30 may optionally comprise an integrated GPS.

Figure 2:
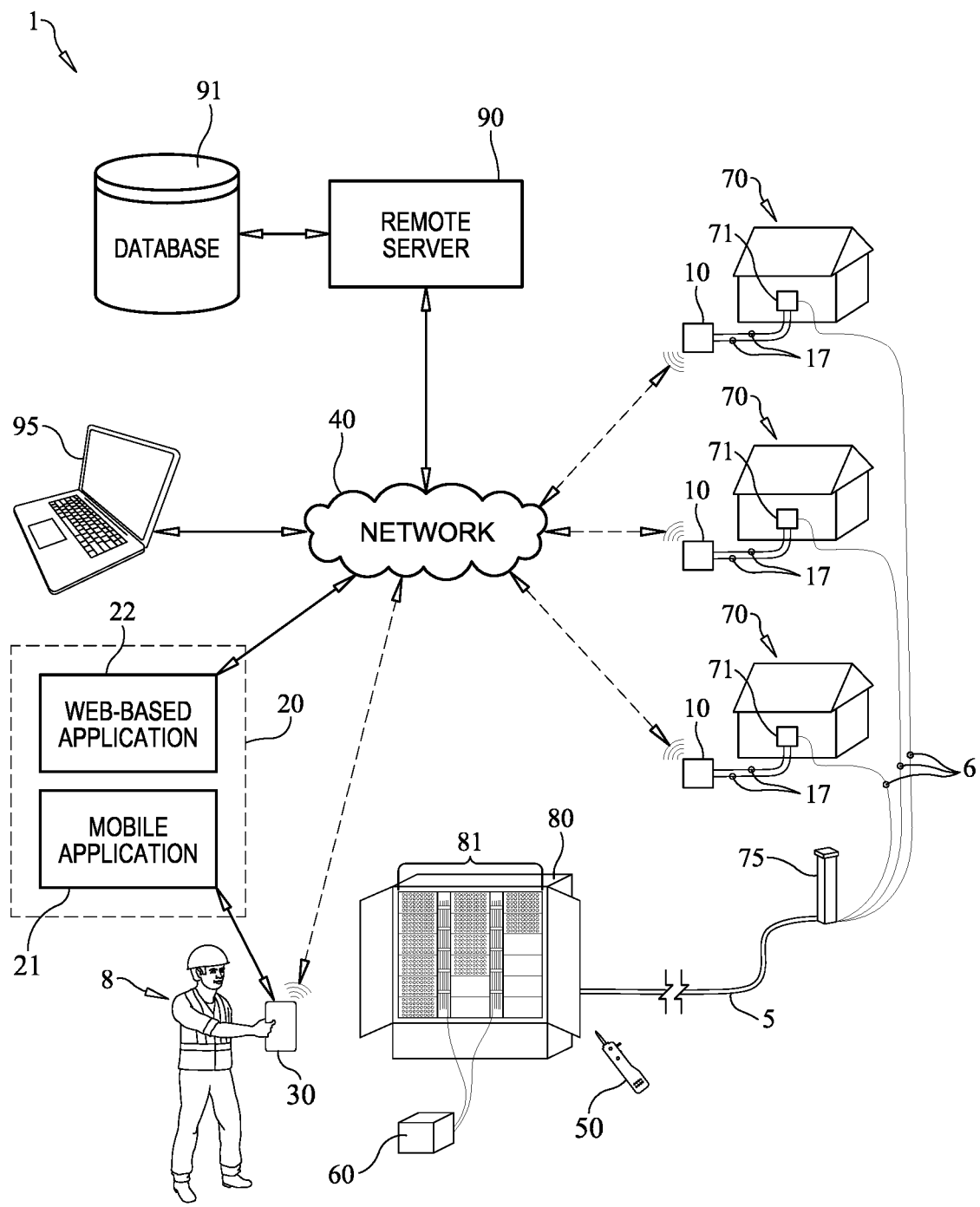
FIG. 2 illustrates a schematic diagram showing the conjunctive relationship of the exemplary embodiment of the cable verification system for telecommunication cables wherein the auxiliary testing device is connected to one or more twisted pairs at a network interface device at an end-user premises.
Figure 3:
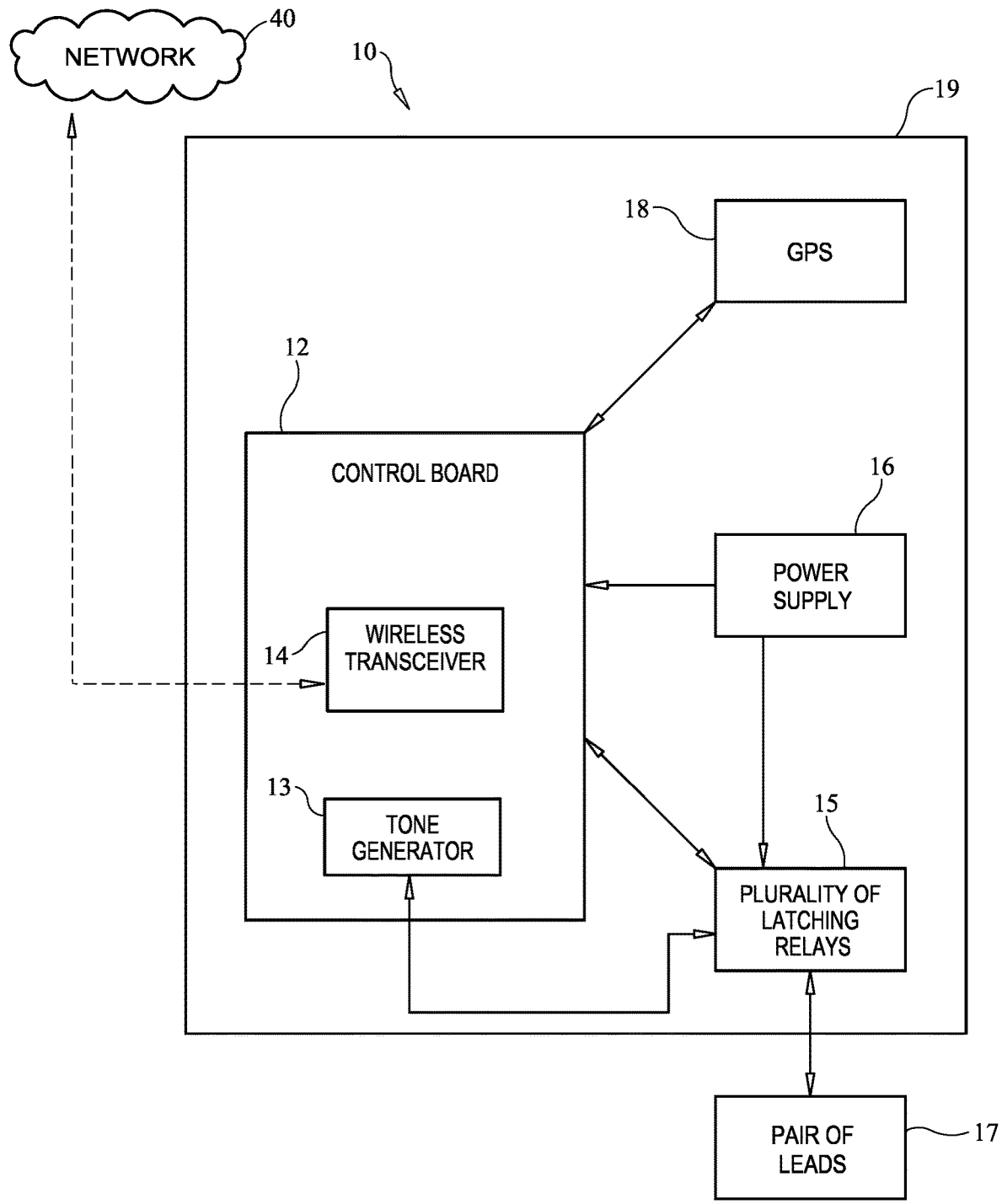
FIG. 3 illustrates a schematic diagram showing various components which the auxiliary testing device comprises.
Figure 9:
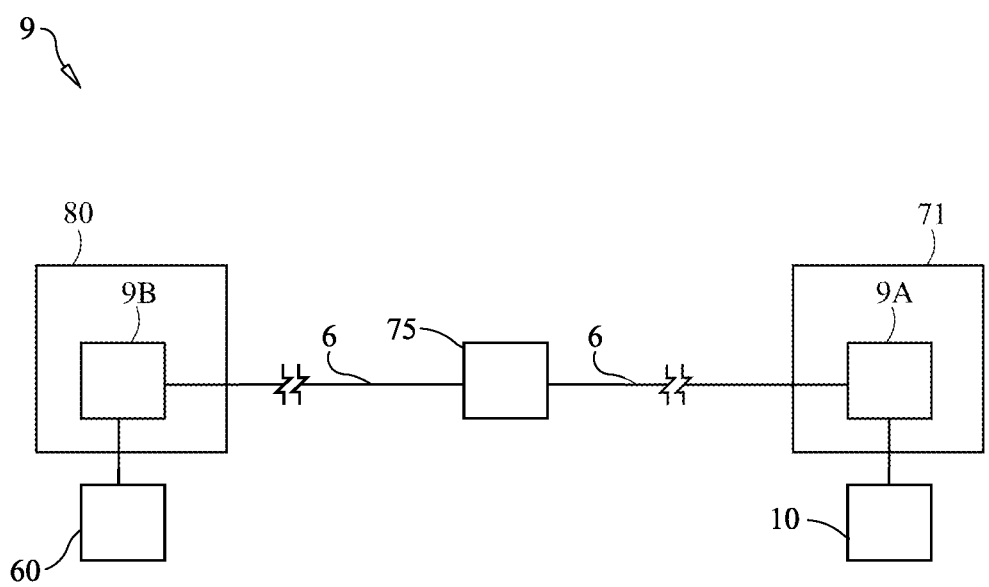
FIG. 9 illustrates a non-limiting exemplary embodiment of a circuit.

As schematically illustrated in FIG. 3, each auxiliary testing device 10 comprises a control board 12, a plurality of latching relays 15, a power supply 16, one or more pairs of leads 17, a GPS 18, and a housing 19. Each auxiliary testing device 10 may further comprise a device ID 11, which is distinct to each device 10 and recognizable by the software application 20. Furthermore, each auxiliary testing device 10 may further comprise one or more tone generators 13. As shown in FIGS. 1 and 2, each of the one or more auxiliary testing devices 10 are installed at their respective first connection point. As schematically illustrated in FIG. 9, the first connection point may take place at a network interface device 71, which as shown in FIGS. 1 and 2, is substantially located at an end-user premises 70, or, alternatively, at a terminal 75, which is located nearby an end-user premises 70.

The control board 12 is programmable and provides a wireless transceiver 14. The wireless transceiver 14 is configured to communicably couple the control board 14 to the network 40 and enables the technician 8 to remotely control and operate the auxiliary testing device 10 via the software application 20. The control board 12 is programmed to activate, or deactivate, the generation and transmission of one or more tones, as well as actuate one or more of the latching relays 15. It is anticipated that the control board 12 may be configured to generate one or more tones. Such configuration of the control board 12 includes, but may not be limited to, modifying the programming of the control board 12. The actuation of one or more latching relays comprises either setting or unsetting the one or more latching relays.

The software application 20 is configured to communicate with the auxiliary testing device 10 is accessible using the portable communication device 30 or a workstation 95. Such remote control and operation of the auxiliary testing device 10 comprises the generation and transmission of one or more tones into the twisted pair 6 which is communicably coupled to the auxiliary testing device 10. The remote control and operation of the auxiliary testing device 10 further comprises actuating one or more latching relays to assist a network cable testing device 60 with performing one or more cable verification tests without requiring the technician 8 first return to the first connection point.

The plurality of latching relays 15 are configured to allow for testing the continuity of the twisted pair 6, or fiber optic cable, as well as for identifying one or more faults within the twisted pair 6, or fiber optic cable. The one or more tone generators 13 are located within the housing 19, as shown schematically in FIG. 3. Each tone generator 13 is respectively communicably coupled to a distinct pair of leads 17 and the control board 10. Each pair of leads 17 comprises two leads. Each lead comprises a first end and a distal end. The distal end of each lead connects to a connector 17A.

Figure 10:
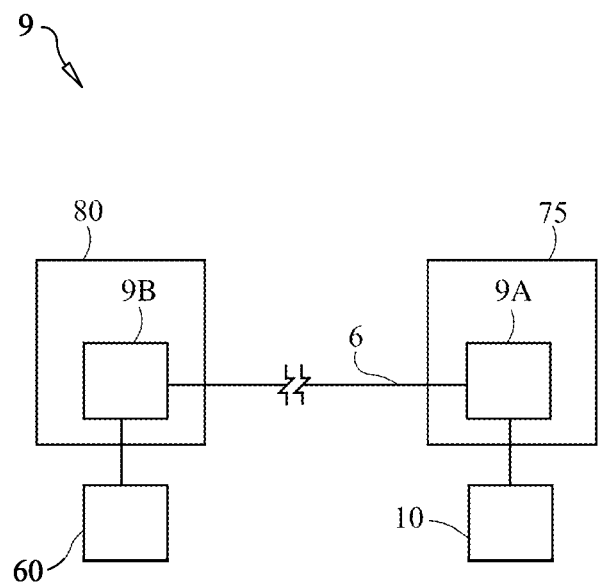
FIG. 10 illustrates an alternative non-limiting exemplary embodiment of the circuit.

Referring to FIG. 9, a non-limiting exemplary embodiment of a circuit 9 is schematically shown. Referring to FIG. 10, an alternative non-limiting exemplary embodiment of the circuit 9 is schematically shown. The circuit 9 spans between the first and second connection points and comprises the twisted pair 6. The circuit 9 may be electric or optical, depending on whether the cable 5 comprises one or more twisted pairs 6 or one or more fiber optic cables.

Each connector 17A is configured to detachably connect to a distinct wire 7 of the twisted pair 6 at a first connection point 9A. The network cable testing device 60 is configured to be communicably coupled to the twisted pairs 6 at a second connection point 9B, which, as shown in FIGS. 1, 2, 9, and 10, may be located at a cross-box 80.

It is anticipated that the auxiliary testing device 10 may be configured to concurrently communicably couple to more than one circuit 9. It is further anticipated that the network cable testing device 60 may be configured to concurrently communicably connect to multiple circuits 9.

Each connector 17A is constructed of one or more materials. The one or more materials comprise an electrically conductive material which is suitable for carrying an electric current. The electrically conductive material may comprise copper, a copper alloy, aluminum, an aluminum alloy, or any other electrically conductive metal or metal alloy. It is anticipated that the connector 17A may, alternatively, comprise a fiber optic cable coupler configured for communicably coupling its respective lead to one or more fibers of a fiber optic cable.

Figure 4:
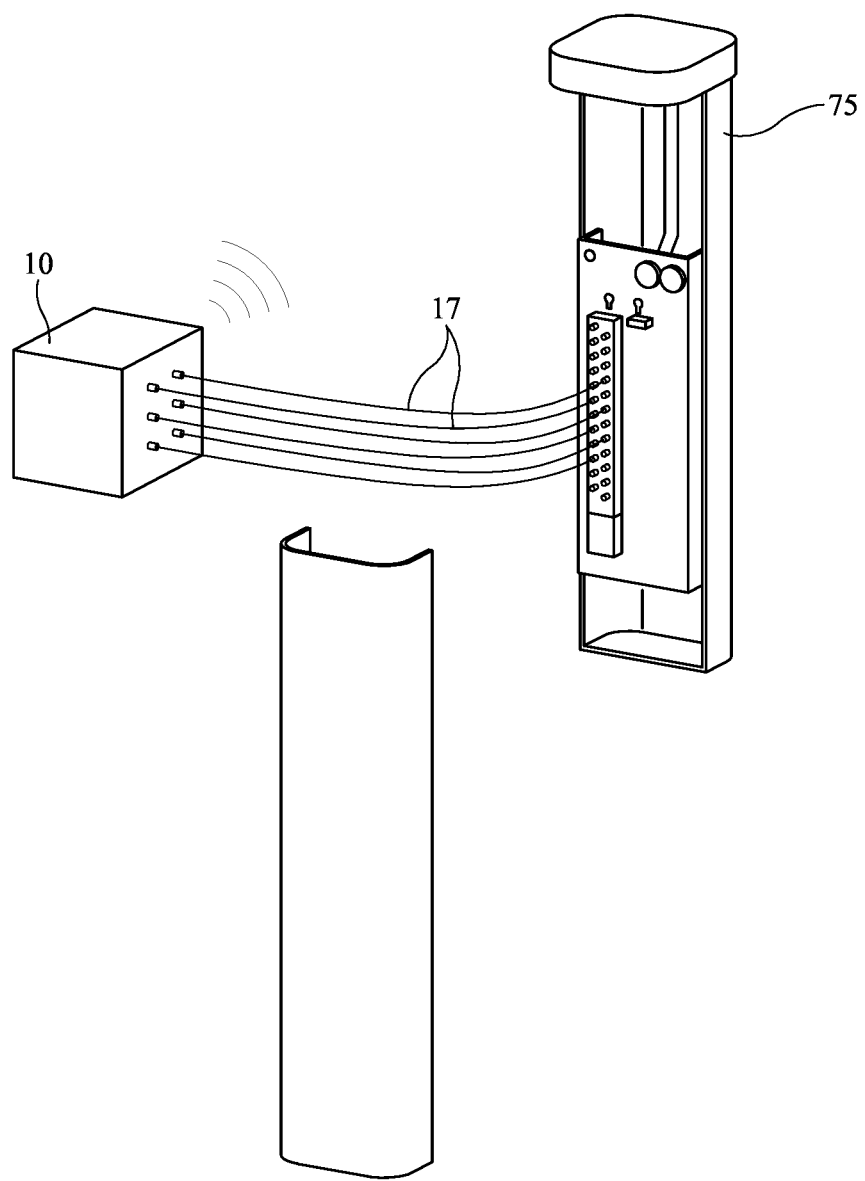
FIG. 4 illustrates the auxiliary testing device connected to a terminal.
Figure 5:
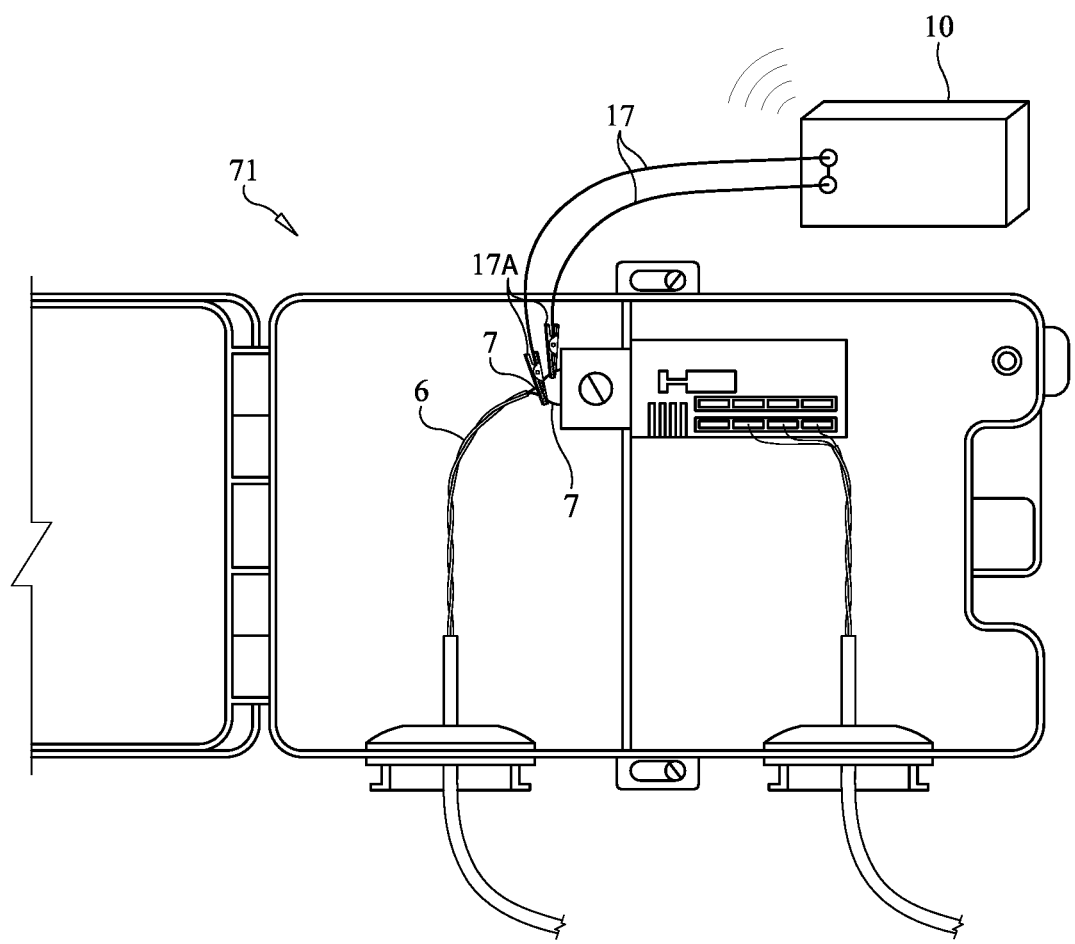
FIG. 5 illustrates an enlarged view of a network interface device connected to the auxiliary testing device.

Each of the one or more auxiliary testing devices 10 are installed at a first connection point 9A, each of which may be distinct with respect to the corresponding auxiliary testing device 10, as shown in FIG. 2. The first connection point 9A may take place at a network interface device 71, substantially located at an end-user premises 70, as shown in FIGS. 2 and 5. Alternatively, the first connection point 9A may take place at a terminal 75, located nearby the end-user premises 70, as shown in FIGS. 1 and 4.

As exemplified in FIG. 5, the installation of the auxiliary testing device 10 comprises detachably connecting the connector 17A of each lead to a respectively distinct wire 7, such that each pair of leads 17 is communicably coupled a respectively distinct twisted pair 6. If utilizing the auxiliary testing device 10 for tracing one or more fiber optic cables, each connector 17A of the pair of leads 17 must communicably couple to a distinct fiber of the fiber optic cable. It is anticipated that the auxiliary testing device 10 may be utilized to communicably couple to and subsequently tone one or more fiber optic cables.

It is further anticipated that the auxiliary testing device 10 may provide an option for performing time domain reflectometry ("TDR") testing, or resistive fault location ("RFL") testing, by modifying the configuration of the control board 12 to accommodate such additional tests. Performance of a TDR or RFL test with the auxiliary testing device 10 would take place at the first connection point 9A and provide the technician 8 with additional insight about the quality and connectively of the twisted pair 8, or fiber optic cable, prior to traveling to the second connection point 9B to trace and identify the twisted pair 8, or fiber optic cable. Thus, performing the TDR or RFL test at the first connection point 9A with the auxiliary testing device 10 assists the technician 8 in further improving his or her efficiency.

After the one or more auxiliary testing devices 10 have been installed at each device's 10 respective first connection point 9A, the technician 8 may then proceed with accessing the software application 20, via the portable communication device 30, or workstation 95, to remotely activate the generation and transmission of one or more tones. The generation and transmission of one or more tones results in the injection of a continuous, alternating, or pulsating tone within each twisted pair 6, or fiber optic cable, which the auxiliary testing device 10 is communicably coupled to.

The technician 8 may then utilize the probe 50 substantially at the second connection point 9B to trace and identify each of the one or more twisted pairs 6 which are communicably coupled to the auxiliary testing device 10. Alternatively, if such tracing is to be performed on one or more fiber optic cables that are communicably coupled to the auxiliary testing device 10, the technician 8 may visually identify the one or more fiber optic cables without the assistance of the probe 50.

After each of the twisted pairs 6, or fiber optic cables, are traced and identified at, or substantially nearby, the second connection point 9B, the technician 8 may then proceed with communicably coupling the network cable testing device 60 to each of the respective twisted pairs 6. As shown in FIGS. 1 and 2, the cross-box 80 provides a plurality of connection terminals 81 which can be utilized to communicably couple the network cable testing device 60 to the one or more twisted pairs 6 that are communicably coupled to the one or auxiliary testing devices 10.

The technician 8 may then proceed with accessing the mobile application 21, via the portable communication device 30, to remotely deactivate the generation of the one or more tones from the auxiliary testing device 10. The technician 8 may then remotely configure the auxiliary testing device 10 to prepare the circuit 9 such that the network cable testing device 60 can be utilized to perform one or more cable verification tests for each of the twisted pairs 6, or fiber optic cables, which are communicably coupled to the one or more auxiliary testing devices 10 and network cable testing device 60. Conventional discrete tone generators are not configured to allow the technician 8 to remotely control and operate the tone generator for tracing purposes as well as remotely assist the technician 8 in testing continuity and fault identification.

Each latching relay of the plurality of latching relays 15 are preferably double pole double throw ("DPDT") relays. However, it is anticipated that single pole double throw ("SPDT") relays could alternatively be used. There are several advantages of using DPDT relays as opposed to SPDT relays. Such advantages include, but are not limited to, the auxiliary testing device 10 requiring fewer latching relays 15 to communicably couple to each twisted pair 6. Another advantage of using DPDT relays is the size and manufacturing cost of auxiliary testing device 10 are reduced relative to the size and manufacturing cost of the device 10 when SPDT relays are utilized. Yet another advantage of utilizing a pair of DPDT relays within the auxiliary testing device 10 as opposed to a set of SPDT relays is the pair of DPDT relays consume less power relative to the set of SPDT relays.

The plurality of latching relays 15 may be communicably coupled within the auxiliary testing device 10 using a variety of circuitry configurations. The variety of configurations are influenced by the type of latching relay which the plurality of latching relays 15 comprises. For each pair of leads 17 which the auxiliary testing device 10 comprises, the auxiliary testing device 10 must also comprise either a pair DPDT relays or a set SPDT relays. Each set of SPFT relays consists of four distinct SPDT relays.

If the plurality of latching relays 15 consist of one or more pairs of DPDT relays, each pair of DPDT relays comprises a first DPDT relay and a second DPDT relay. In such a configuration, both leads of a single pair of leads 17 are electrically coupled to a first DPDT relay. The second DPDT relay of each pair of DPDT relays is communicably connected to its respective first DPDT relay and the control board 12. The control board 12 and pair of DPDT relays are communicably connected in series wherein the second DPDT relay is communicably positioned between the first DPDT and the control board 12.

Each pair of DPDT relays are configured to be normally closed, until actuated to an open state, and thus allow the control board 12 to transmit a tone into a twisted pair 6, or fiber optic cable, after the twisted pair 6 is communicably coupled to the pair of leads 17 that are communicably coupled to the first DPDT relay. Actuating the first DPDT relay to an open state creates a short in the circuit 9 between the first and second connection points 9A,9B. Actuating the second DPDT relay, to an open state creates an open circuit 9 between the first and second connection points 9A,9B.

Figure 8:
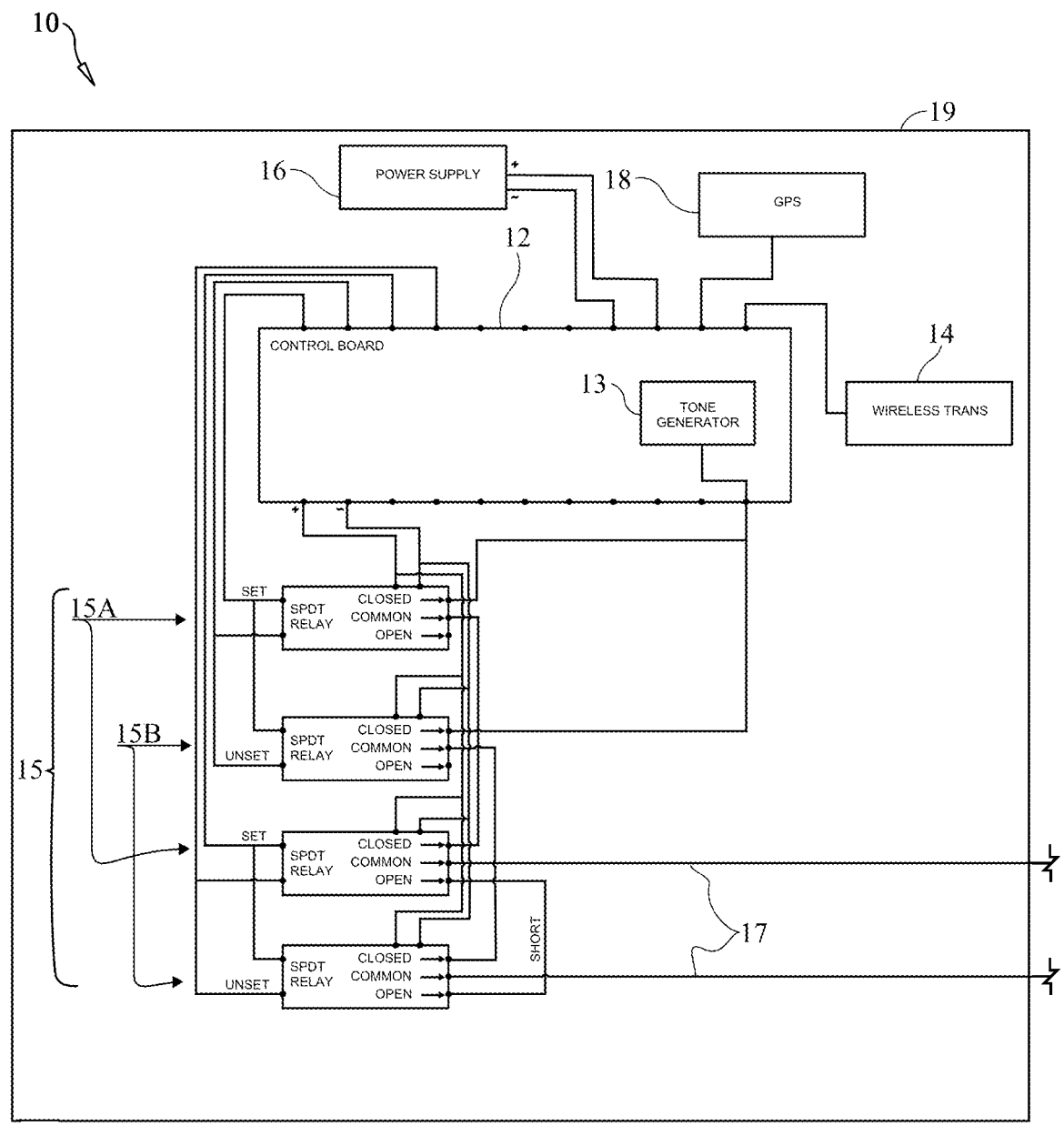
FIG. 8 illustrates a schematic wiring diagram of an exemplary embodiment of the auxiliary testing device comprises.

Alternatively, if the plurality of latching relays 15 consists of one or more sets of SPDT relays, each set of SPDT relays may be communicably coupled to one another and the control board 12. Referring to FIG. 8, an exemplary circuitry configuration is schematically illustrated and shows the electrical wiring that interconnects the SPDT relays to one another and the control board 12. As shown in FIG. 8, each of the one or more sets of SPDT relays comprise a first pair of SPDT relays 15A and second pair of SPDT relays 15B. In the exemplary circuitry configuration illustrated in FIG. 8, each SPDP pair 15A, 15b is electrically connected in series with the control board 12.

Each lead of the pair of leads 17 communicably coupled to the set of SPDT relays connects to a distinct pair of SPDT relays wherein each pair of SPDT relays is separately communicably connected to the control board 12 in series. As shown in FIG. 8, in this exemplary circuitry configuration, one SPDT relay of each pair of SPDT relays directly connects to one distinct lead of the pair of leads 17. The other SPDT relay of each pair of SPDT relays is serially connected to and communicably positioned between the control board 12 and the other SPDT relay of the pair of SPDT relays. It is also anticipated that the SPDT relays could, alternatively, be communicably connected to the control board 12 and one or more other SPDT relays in parallel.

It is further anticipated that a DPDT relay and a pair of SPDT relays could be configured to be communicably coupled to each other, the control board 12, and a respective pair of leads 17 in a circuitry configuration that allows the auxiliary testing device 10 to also perform the same functions relative to the aforementioned configurations. In such a configuration, one lead would connect to the DPDT relay, which would be communicably coupled to the control board 12, and the other lead of the pair of leads 17 would directly connect to one of the SPDT relays. The other SPDT relay of the pair of SPDT relays would be serially connected between the control board 12 and the SPDT relay that is directly connected to the other lead.

Figure 6:
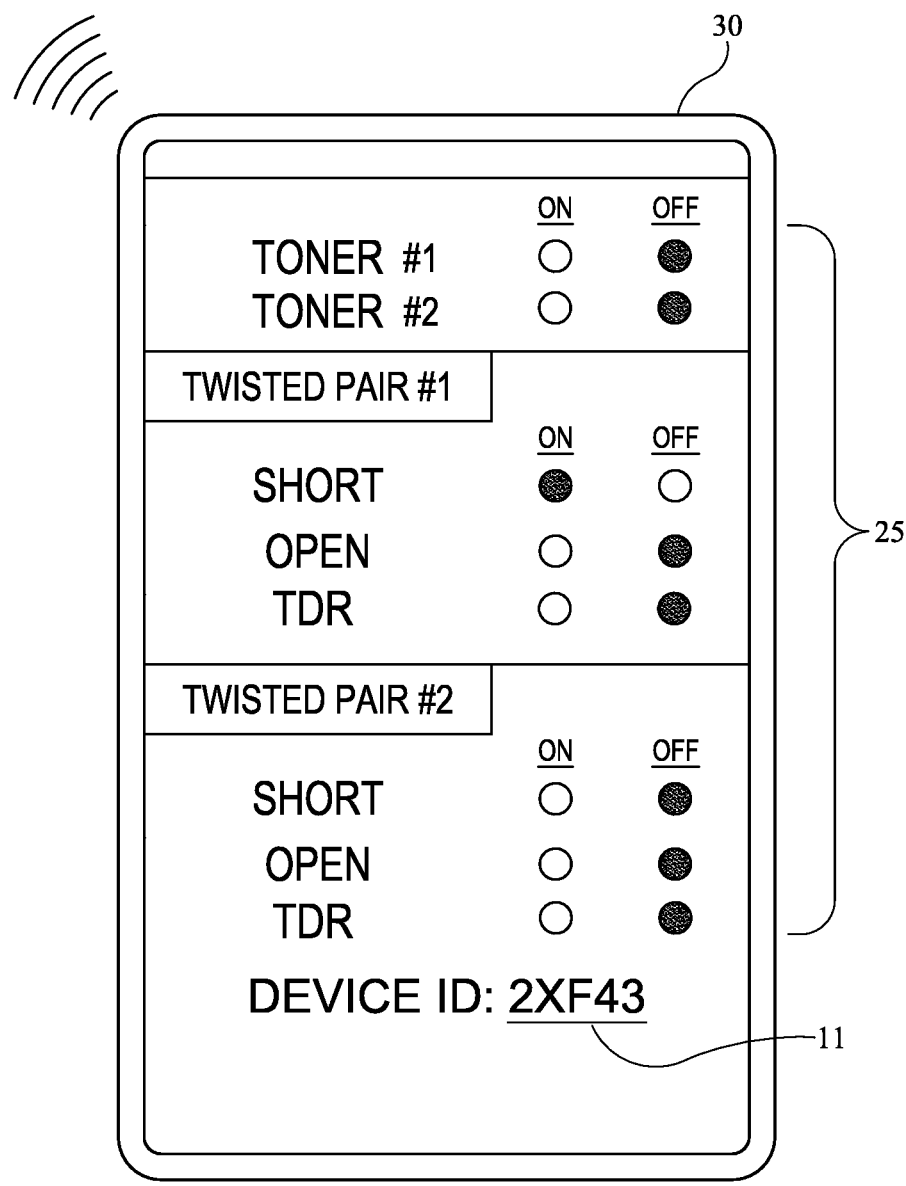
FIG. 6 illustrates an exemplary user interface of a mobile application on a portable communication device.

An exemplary user interface of the mobile application 21 is exemplified in FIG. 6. The technician 8, or any other user of the cable verification system 1, may interact with the software application 20 through either the portable communication device 30 or workstation 95. The user interface is configured to allow the technician 8 to easily access a variety of control features 25 to remotely control and operate the auxiliary testing device 10. The variety of control features conveniently and efficiently allow the technician 8 to remotely turn on or off the tone generator 13 as well as actuate one or more latching relays.

Figure 7:
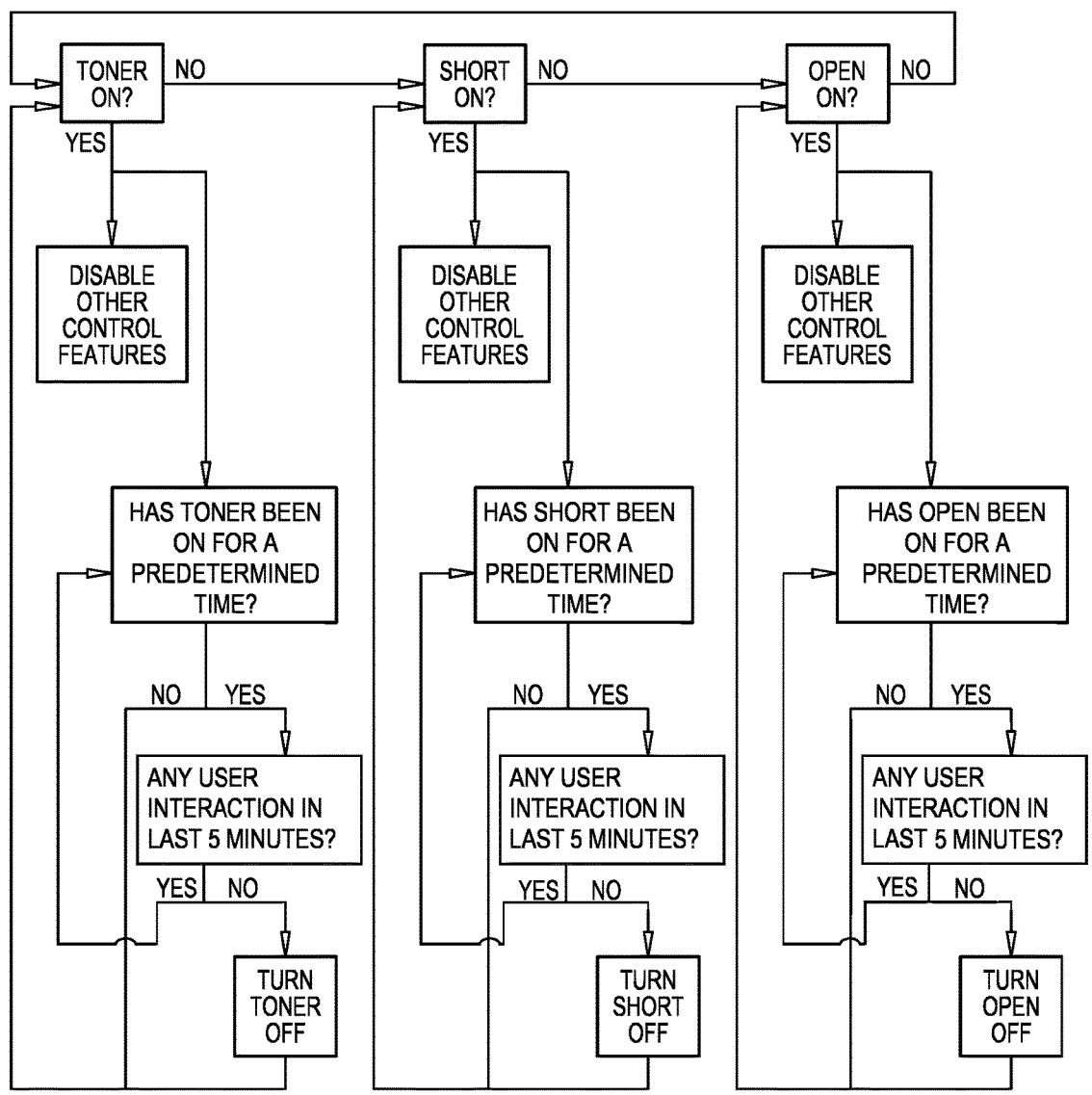
FIG. 7 illustrates a schematic diagram of a sequence logic configured to control the auxiliary testing device.

The software application 20 utilizes a logic sequence 24, to prevent the control board 12 from performing more than one cable verification test concurrently on the same twisted pair 6, or fiber optic cable. Additionally, the logic sequence 24 prevents one or more cable verification tests from initiating for a twisted pair 6, or fiber optic cable, if the tone generator 13 which is communicably couple to the respective twisted pair 6 is actively generating and transmitting a tone within the twisted pair 6, or fiber optic cable. The logic sequence 24 is further configured to turn off the tone generator 13, or terminate a cable verification test, if the tone generator 13, or cable verification test, has been active for more than a predetermined time and the technician 8 has not interacted with the user interface of the software application 20 for a period of time greater than a second predetermined time. The logic sequence 24 exemplified within FIG. 7 is not intended to limit, in any respect, the configurability of the software application 20.

To perform a fault identification test, the auxiliary testing device 10 is configured to short the circuit 9 which spans substantially between the first and second connection points 9A,9B prior to the network cable testing device 60 initiating the test. To perform an electrical, or optical, continuity test, the auxiliary testing device 10 is configured to open the circuit 9, which spans between the two connection points 9A, 9B, via actuation of one or more of the plurality of latching relays 15. After the auxiliary testing device 10 has opened the circuit 9, via the actuation of one or more latching relays, the network cable testing device 60 is then utilized to initiate the continuity test.

The remote control and operation of the auxiliary testing device 10 allows for the technician 8 to perform the one or more cable verification tests within needing to return to the first connection point 9A. While conventional manual processes may be utilized to perform one or more cable verification tests, such conventional manual processes require additional time, relative to using the auxiliary testing device 10, for the technician 8 to perform because such processes require the technician 8 travel back and forth between the two connection points to perform the cable verification tests. The clever configuration of the plurality of latching relays 15 within the auxiliary testing device 10 and remote control and operation of the device 10 allows for the technician 8 to efficiently perform one or more cable verification tests. Reducing the number of trips the technician 8 must make between the first and second connection points 9A,9B while on site may also reduce the technician's 8 risk of becoming party to an adverse event while on site. Thus, the auxiliary testing device 10 also aids in improving the safety of the working conditions for the technician 8.

It is anticipated the technician 8 may, alternatively, sequentially trace, identify, and perform one or more cable verification tests for each twisted pair 6, or fiber optic cable, that is communicably coupled to the auxiliary testing device 10 before proceeding to trace, identify, and test one or more other twisted pairs 6, or fiber optic cables, that are also communicably coupled to one or more other auxiliary testing devices 10. However, it is preferable, for efficiency purposes, that the technician 8 trace and identify all twisted pairs 6, or fiber optic cables, prior to utilizing the network cable testing device 60 to perform one or more cable verification tests.

Additional cable testing, such as cable qualification or certification testing, may be performed using the network cable testing device 60. After completing all required cable testing, the technician 8 may then return to the first connection point 9A of each auxiliary testing device 10 to disconnect and retrieve each device 10. It is anticipated that the software application 20 may communicate with the GPS 18 of each auxiliary testing device 10 to identify the approximate location of the respective auxiliary testing device 10 to assist the technician 8 in retrieving each of the one or more auxiliary testing devices 10. It is further anticipated that the software application 20 may alert the technician 8 if the portable communications device 30 if the distance between the portable communications device 30 and the auxiliary testing device 10 is greater than a predetermined distance. Such alerts may assist the technician 8 in unintentionally not retrieving one or more auxiliary testing devices 10 from the device's 10 first connection point 9A.

It is anticipated in an alternative embodiment of the cable verification system 1 the auxiliary testing device 10 may already be permanently installed at each network interface device 71. Such permanent installation would require the technician 8 to have prerequisite knowledge of the device ID 11 for each permanently installed auxiliary testing device 10 and the end-user premises 70 where each device 10 was previously installed in order to remotely access and operate the correct device 10 without having travel to the first connection point 9A to identify the device 10. It is further anticipated that such prerequisite knowledge could be aggregated, stored, and accessed in a database 91, provided by a remote server 90, which integrates with the software application 20.

In such an alternative embodiment, the technician 8 may further utilize the software application 20 to identify the auxiliary testing device 10 which associated with the particular end-user premises 70. Remotely controlling and operating the auxiliary testing device 10 without needing to initially travel to the first connection point 9A to install the device 10 would allow for additional time savings. Moreover, such additional time savings would be further compounded by allowing the technician 8 to complete the job without having return to the first connection point 9A to disconnect and retrieve the auxiliary testing device 10.

While the embodiments of the present invention have been disclosed, certain modifications may be made by those skilled in the art to modify the invention without departing from the spirit of the invention. Other apparatuses, systems, or methods in accordance with embodiments of the present invention will be or become apparent to one with skill in the art upon examination of the following drawings and detailed description. It is intended that all such additional apparatuses, systems, or methods be included within this description, be within the scope of the present invention, and be encompassed by the accompanying claims.

The invention claimed is:

1. A cable verification system for telecommunication cables comprising:
   a. a network;
   b. a portable communication device;
      wherein the portable communication device is configured to wirelessly connect to the network;
   c. a circuit;
      wherein the circuit comprises a twisted pair;
      wherein the circuit spans between the first and second connection points;
   d. a probe;
   e. an auxiliary testing device;
      wherein the auxiliary testing device is installed at the first connection point;
      wherein the auxiliary testing device comprises a housing, a control board, a wireless transceiver, a power supply, a plurality of latching relays, and one or more pairs of leads;
      wherein the auxiliary testing device is configured to be remotely controlled and operated;
      wherein the auxiliary testing device is configured to generate and transmit one or more tones into the twisted pair;
      wherein the auxiliary testing device is configured to short the circuit;
      wherein the auxiliary testing device is configured to open the circuit;
      wherein the control board is communicably coupled to the plurality of latching relays, the wireless transceiver, and the one or more pairs of leads;
      wherein the wireless transceiver communicably couples the auxiliary testing device to the network;
      wherein the pair of leads are configured to communicably couple the auxiliary testing device to the twisted pair;
   f. a software application;
      wherein the software application is configured to communicate with the auxiliary testing device and enable the user to remotely control and operate the auxiliary testing device;
      wherein the software application comprises a mobile application;
      wherein the mobile application is configured to be accessed by a user through the portable communication device;
   g. a network cable testing device;
      wherein the network cable testing device is installed at the second connection point;
      wherein the network cable testing device is configured to be communicably coupled to the twisted pair;

wherein the network cable testing device is configured to perform one or more cable verification tests.

2. The cable verification system for telecommunication cables of claim 1, wherein the plurality of latching relays comprise one or more pairs of double pole double throw latching relays.

3. The cable verification system for telecommunication cables of claim 1, wherein the plurality of latching relays comprise one or more sets of single pole double throw latching relays.

4. The cable verification system for telecommunication cables of claim 3, wherein each of the one or more sets of single pole double throw latching relays comprise four single pole double throw latching relays.

5. The cable verification system for telecommunication cables of claim 1, wherein the remote control and operation of the auxiliary testing device comprises actuating one or more of the latching relays of the plurality of latching relays to create a short in the circuit.

6. The cable verification system for telecommunication cables of claim 1, wherein the remote control and operation of the auxiliary testing device comprises actuating one or more of the latching relays of the plurality of latching relays to create an open circuit between the first connection point and second connection point.

7. The cable verification system for telecommunication cables of claim 1, wherein the first connection point is substantially located at a terminal.

8. The cable verification system for telecommunication cables of claim 1, wherein the first connection point is substantially located at a network interface device.

9. The cable verification system for telecommunication cables of claim 8, wherein the network interface device is substantially located at the end-user premises.

10. The cable verification system for telecommunication cables of claim 1, wherein the second connection point is substantially located at a cross-box.

11. The cable verification system for telecommunication cables of claim 1, wherein the control board is configured to generate and transmit one or more tones.

12. The cable verification system for telecommunication cables of claim 1, wherein the auxiliary testing device further comprises a tone generator; wherein the tone generator is configured to generate and transmit one or more tones.

13. The cable verification system for telecommunication cables of claim 1, wherein the one or more cable verification tests comprise a continuity test.

14. The cable verification system for telecommunication cables of claim 1, wherein the one or more cable verification tests comprise a fault identification test.

15. The cable verification system for telecommunication cables of claim 1, wherein the auxiliary testing device is configured to perform a time domain reflectometry test.

* * * * *